(12) United States Patent
Jiang

(10) Patent No.: US 9,905,391 B2
(45) Date of Patent: Feb. 27, 2018

(54) SYSTEM AND METHOD FOR IMAGING A SAMPLE WITH AN ELECTRON BEAM WITH A FILTERED ENERGY SPREAD

(71) Applicant: KLA-Tencor Corporation, Milpitas, CA (US)

(72) Inventor: Xinrong Jiang, Palo Alto, CA (US)

(73) Assignee: KLA-Tencor Corporation, Milpitas, CA (US)

(*) Notice: Subject to any disclaimer, the term of this patent is extended or adjusted under 35 U.S.C. 154(b) by 41 days.

(21) Appl. No.: 14/826,007

(22) Filed: Aug. 13, 2015

(65) Prior Publication Data

US 2016/0322190 A1 Nov. 3, 2016

Related U.S. Application Data

(60) Provisional application No. 62/154,650, filed on Apr. 29, 2015.

(51) Int. Cl.
*H01J 1/50* (2006.01)
*H01J 37/05* (2006.01)

(52) U.S. Cl.
CPC ......... *H01J 37/05* (2013.01); *H01J 2237/057* (2013.01); *H01J 2237/12* (2013.01); *H01J 2237/14* (2013.01)

(58) Field of Classification Search
CPC .. H01J 37/00; H01J 37/02; H01J 37/05; H01J 37/10; H01J 37/12; H01J 37/14; H01J 37/141; H01J 37/147

(Continued)

(56) References Cited

U.S. PATENT DOCUMENTS

| 4,439,685 A | * | 3/1984 | Plies | H01J 37/045 |
| | | | | 250/396 R |
| 5,187,371 A | * | 2/1993 | Matsui | H01J 37/12 |
| | | | | 250/396 R |

(Continued)

FOREIGN PATENT DOCUMENTS

WO 2014065663 A1 5/2014

OTHER PUBLICATIONS

Richard Young et al., XHR SEM: Enabling extreme high resolution scanning electron microscopy, Proc. SPIE 7378, Scanning Microscopy 2009, 737803, May 22, 2009, pp. 737803-1-737803-15.

(Continued)

*Primary Examiner* — Jason McCormack
(74) *Attorney, Agent, or Firm* — Suiter Swantz pc llo

(57) ABSTRACT

A selectively configurable system for directing an electron beam with a limited energy spread to a sample includes an electron source to generate an electron beam having an energy spread including one or more energies, an aperture having an on-axis opening and an off-axis opening, a first assembly of one or more electron lenses with selectively configurable focal powers positioned to collect the beam from the source and direct the beam to the aperture, a second assembly of one or more selectively configurable electron lenses positioned to collect the beam, a sample stage, and an electron inspection sub-system including electron optics positioned to direct the beam onto one or more samples. The first assembly includes an off-axis electron lens for interacting with the beam at an off-axis position and introducing spatial dispersion to the beam when configured with a nonzero focal power, thus filtering the energy spread.

20 Claims, 15 Drawing Sheets

(58) Field of Classification Search
USPC .............. 250/306, 307, 311, 396 R, 396 ML
See application file for complete search history.

(56) References Cited

U.S. PATENT DOCUMENTS

| | | | |
|---|---|---|---|
| 6,452,193 | B1 | 9/2002 | Goto |
| 2002/0043629 | A1 | 4/2002 | Benner |
| 2009/0200482 | A1* | 8/2009 | Kim ....................... B82Y 10/00 250/396 R |
| 2012/0112062 | A1* | 5/2012 | Novak .................... H01J 37/18 250/307 |
| 2012/0223244 | A1 | 9/2012 | Welkie |
| 2013/0256530 | A1 | 10/2013 | Jiang et al. |
| 2015/0371811 | A1* | 12/2015 | Ogawa .................... H01J 37/12 250/305 |

OTHER PUBLICATIONS

PCT International Search Report for Application No. PCT/US2016/029881 dated Aug. 9, 2016, 3 pages.

* cited by examiner

SYSTEM AND METHOD FOR IMAGING A SAMPLE WITH AN ELECTRON BEAM WITH A FILTERED ENERGY SPREAD

CROSS-REFERENCE TO RELATED APPLICATIONS

The present application claims the benefit under 35 U.S.C. § 119(e) of U.S. Provisional Application Ser. No. 62/154,650, filed Apr. 29, 2015. The U.S. Provisional Application Ser. No. 62/154,650 is hereby incorporated by reference in its entirety.

TECHNICAL FIELD

The present disclosure relates generally to electron beam systems and, more particularly, to the filtering of the energy spread of the electron beam.

BACKGROUND

Electron beams have an inherent energy spread that describes a range of energies possessed by electrons within the beam. The resolution of an electron beam system may be limited by a range of factors including diffraction, aberrations, and Coulomb interactions between electrons in the beam. The dominant limitation of the resolution in a given electron beam system is generally dependent on the physical design of the system as well as the beam size and path through the system, the latter of which may vary depending on the specific application. For example, resolution in high beam current applications are typically dominantly limited by Coulomb interactions between electrons in the beam and by spherical aberrations associated with relatively large beam diameters. In contrast, resolution of low-current applications is typically limited by the energy spread of the electron beam. The energy spread can limit the performance of an electron beam system in a variety of ways, such as reducing the resolution through chromatic aberrations, degrading image uniformity across a field of view, limiting the allowable beam tilt angle for wall information of a wafer fixture in a review system, and introducing energy-dispersion effects that lead to a reduction of resolution in a Wien filter used to split secondary electrons from primary electrons in the system. It is therefore desirable to develop systems and methods to limit the energy spread of an electron beam source, particularly for high-resolution applications.

SUMMARY

A system for generating an electron beam with a limited energy spread is described in accordance with an illustrative embodiment of the present disclosure. In one embodiment, the system includes an electron source configured to generate an electron beam having an energy spread including one or more energies. In another embodiment, the system includes a dispersing electron lens, wherein the dispersing electron lens is positioned such that the electron beam is incident on the dispersing electron lens at an off-axis position, wherein the dispersing electron lens is further positioned to introduce spatial dispersion into the electron beam. In another embodiment, the system includes an aperture having one or more openings, wherein the aperture is positioned to pass at least a portion of the electron beam such that the energy spread of the electron beam is filtered.

A system for directing a beam of electrons with a limited energy spread to a sample is described in accordance with one embodiment of the present disclosure. In one embodiment, the system includes an electron source configured to generate an electron beam having an energy spread including one or more energies. In another embodiment, the system includes an energy filtering sub-system. In another embodiment, the energy filtering sub-system includes a first electron lens positioned such that the beam is incident on the first electron focusing element at an off-axis position and further positioned to introduce spatial dispersion into the beam. In another embodiment, the energy filtering sub-system includes an aperture having one or more openings positioned to pass at least a portion of the beam such that the energy spread of the beam is filtered. In another embodiment, the energy filtering sub-system includes a second electron lens positioned along a second optical axis, wherein the second electron lens is positioned to collect the beam directed from the aperture. In another embodiment, the system includes a sample stage for securing one or more samples. In another embodiment, the system includes an electron inspection sub-system including one or more electron optics positioned to direct the beam onto the one or more samples.

A selectively configurable system for directing a beam of electrons with a limited energy spread to a sample is described in accordance with an illustrative embodiment of the present disclosure. In one embodiment, the system includes an electron source configured to generate an electron beam having an energy spread including one or more energies. In another embodiment, the system includes an aperture having an on-axis opening and an off-axis opening. In another embodiment, the system includes a first assembly of one or more electron lenses with selectively configurable focal powers positioned to collect the beam from the source and direct the beam to the aperture. In another embodiment, the first assembly includes an off-axis electron lens configured to interact with the beam at an off-axis position and further configured to introduce spatial dispersion to the beam when configured with a nonzero focal power. In another embodiment, the first assembly is configurable in at least a first configuration in which the off-axis electron lens is configured with a nonzero focal power and in which the first assembly of electron lenses is configured to direct the beam to the off-axis opening of the aperture such that the energy spread of the beam is filtered by the aperture. In another embodiment, the first assembly is further configurable in at least a second configuration in which the off-axis electron lens is configured with a focal power of zero and in which the first assembly is configured to direct the beam to the on-axis opening of the aperture such that the energy spread of the beam is not filtered by the aperture. In another embodiment, the system includes a second assembly of one or more selectively configurable electron lenses positioned to collect the beam. In another embodiment, the system includes a sample stage for securing one or more samples. In another embodiment, the system includes an electron inspection sub-system including one or more electron optics positioned to direct the beam onto the one or more samples.

A system for directing a beam of electrons with a limited energy spread to a sample is described in accordance with an illustrative embodiment of the present disclosure. In one embodiment, the system includes an electron source configured to generate an electron beam having an energy spread including one or more energies. In another embodiment, the system includes a first electron lens positioned to collect the beam from the electron source. In another embodiment, the system includes an aperture having an on-axis opening. In another embodiment, the system includes a second electron lens positioned to direct the beam to the aperture. In another embodiment, the system includes a selectively configurable aperture including an opening. In another embodiment, the selectively configurable aperture is positioned between the first and second electron lenses, wherein the location of the opening relative to the optical axis of the first electron lens is selectively configurable. In another embodiment, the selectively configurable aperture is configurable in at least a first configuration in which the location of the opening is configured to pass a portion of the beam to an off-axis location of the second electron lens such that the second electron lens introduces spatial dispersion to the beam and the energy spread of the beam is filtered by the aperture. In another embodiment, the selectively configurable aperture is configurable in at least a second configuration in which the location of the opening is configured to pass a portion of the beam to an on-axis location of the second electron lens such that the second electron lens does not introduce spatial dispersion to the beam and the energy spread of the beam is not filtered by the aperture. In another embodiment, the system includes a third electron lens positioned to collect the beam. In another embodiment, the system includes a sample stage for securing one or more samples. In another embodiment, the system includes an electron inspection sub-system including one or more electron optics positioned to direct the beam onto the one or more samples.

A method for reducing the energy spread of an electron beam is described in accordance with one embodiment of the present disclosure. In one embodiment, the method includes generating an electron beam having an energy spread including one or more energies. In another embodiment, the method includes introducing spatial dispersion into the beam. In another embodiment, the method includes directing the beam onto an aperture with an opening, wherein the aperture is configured to pass at least a portion of the beam, and wherein the energy spread of the beam is filtered by the aperture.

DETAILED DESCRIPTION

Figure 1A:
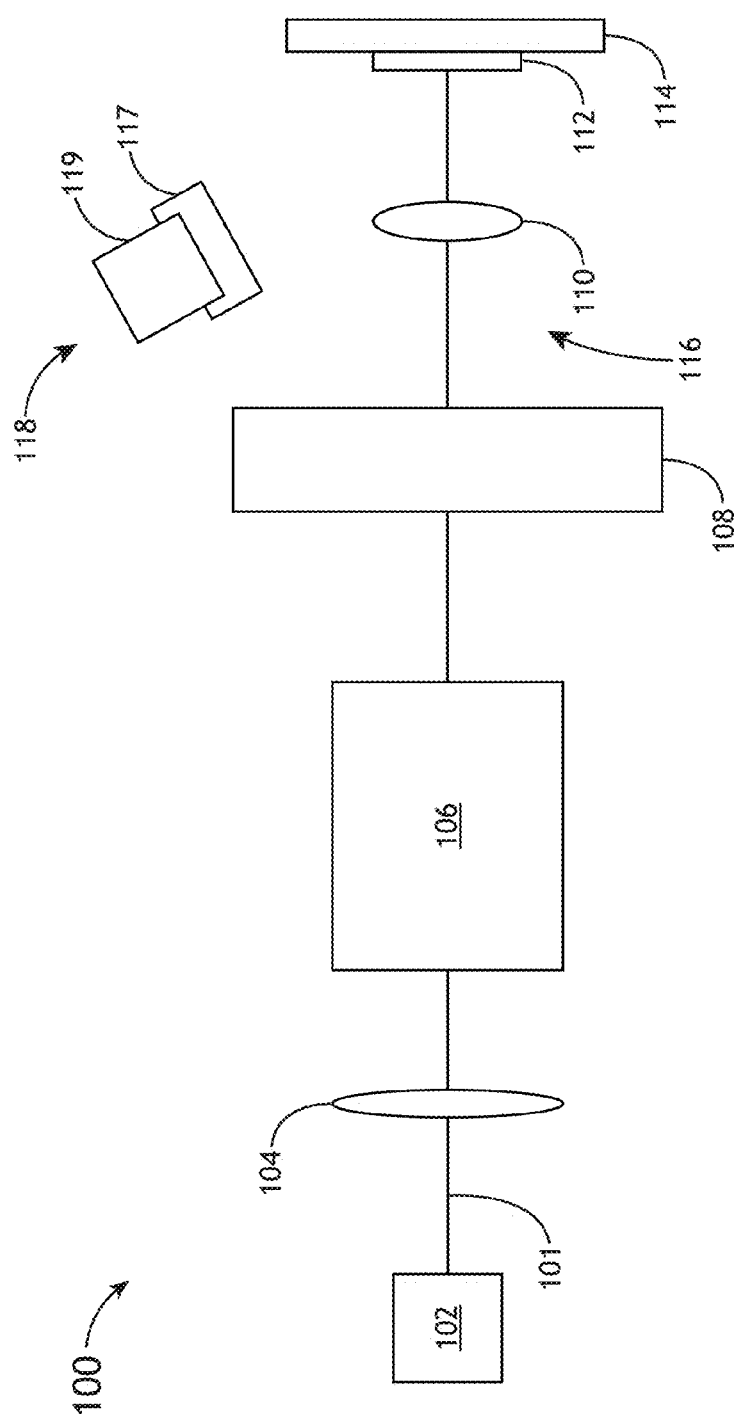
FIG. 1A is a conceptual view of an electron beam system including an orientation of an electron source, an energy filtering sub-system, electron deflectors, an objective, and a detector for imaging a sample with an electron beam in accordance with one embodiment of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

In general, one or more embodiments of the present disclosure encompass systems and methods for the selective control of the energy spread of an electron beam for use in, but not limited to, scanning electron microscopes, scanning electron review systems, transmission electron microscopes, and transmission electron review systems, which are herein referred to as electron beam systems. Electron beam systems typically include, but are not limited to, electron sources, electron focusing elements, electron deflectors, stigmators, sample positioning stages, beam scanning systems, and electron detection optics. It is noted herein that the terms "electron focusing element" and "electron lens" are used interchangeably throughout this disclosure. It is further noted that the focal power of an electron lens may be dynamically adjusted during operation via the operating current, which enables a single physical component to have different focal powers for different modes of operation. The term focal power is sometimes referred to in the art as the optical power or the converging power of a lens and is mathematically described as the inverse of the focal length of the lens: P=1/f, where P is the focal power and f is the focal length of the lens. It is further noted that the focusing power of a typical electron lens is associated with an interaction between an electron beam and electromagnetic fields such as electric and/or magnetic fields. The location at which an electron beam is incident on a lens is then the location at which the electron beam is deflected by the fields associated with the lens.

Referring generally to FIGS. 1-10, a system and method for filtering the energy spread of electron beams are described in accordance with the present disclosure. Embodiments of the present disclosure are directed to the selection of a desired set of energies from the energy spread of an electron beam (i.e. filtering an electron beam). Additional embodiments are directed to the coupling of a filtered electron beam to an objective configured for imaging a sample. Some embodiments of the present disclosure are directed to systems capable of operating in multiple filtering configurations. For example, some embodiments are directed to systems wherein the capability of filtering an electron beam may be selectively engaged or disengaged.

Electron beams have an inherent energy spread, ΔE, which describes a range of energies that electrons within the beam possess. The resolution of an electron beam system may be limited by a range of factors including diffraction, aberrations, and Coulomb interactions between electrons in the beam.

Diffraction effects are related to physical dimensions of various components within the system and are generally not easily minimized given other design restraints. Chromatic aberration, however, is proportional to the energy spread of an electron beam and is characterized by electrons with different energies propagating along different paths through the system, which negatively impacts the system resolution. Chromatic aberration may be induced by elements within an electron beam system such as electron lenses. Chromatic aberration induced by an electron lens occurs when electrons with different energies are deflected at different angles when passing through the electron lens. The degree to which an electron beam passing through an electron lens experiences chromatic aberration is typically dependent on the position of the electron beam relative to the optical axis of the lens, known as the off-axis distance. Generally, the greater the off-axis distance, the greater the effect of chromatic aberration. Additionally, chromatic aberration due to energy dispersion in a Wien filter is directly proportional to the energy spread and further limits the system resolution.

The energy spread of an electron beam in an electron beam system directly influences the scanning field of view (FOV) or throughput the system. The FOV is primarily limited by off-axis aberrations such as coma and chromatic aberration. Reducing the energy spread will reduce the chromatic aberration and allow for optimization of the FOV. Similarly, the degree to which an electron beam system can characterize wall information on a wafer fixture is related to the maximum tilt angle of the electron beam, which is again limited by off-axis aberrations such as coma and chromatic aberration. A reduction of the chromatic aberration by reducing the energy spread will positively impact system performance for this and similar applications.

The dominant limitation of the resolution in a given electron beam system is generally dependent on the desired application and the required beam current. For example, resolution in high-current beam applications is typically dominantly limited by Coulomb interactions between electrons in the beam and by spherical aberrations associated with relatively large beam diameters. In contrast, resolution of low-current beam applications is typically limited by the energy spread of the electron beam.

FIG. 1A is a simplified diagram of a system 100 for imaging a sample with a filtered electron beam 101. In one embodiment, electrons with an energy spread ΔE are generated by an electron source 102 and directed to an electron lens 104. The electron source 102 may include any electron source known in the art. For example, the electron source 102 may include, but is not limited to, one or more electron guns. In another embodiment, the electron beam 101 is then directed to an energy filtering sub-system 106, wherein the energy spread of the beam is filtered such that the resulting beam has an energy spread Δe<ΔE. In one embodiment, the electron inspection sub-system includes, but is not limited to, an objective 110 further positioned to direct the beam onto one or more samples 112 located on one or more positionable sample stages 114. In another embodiment, the electron inspection sub-system 116 includes one or more electron deflectors 108 positioned to direct the beam into the objective 110. In one embodiment, sample 112 includes, but is not limited to, a wafer (e.g., semiconductor wafer). In some embodiments, a detector assembly 118 is positioned to image or otherwise analyze the one or more samples 112.

Figure 1B:
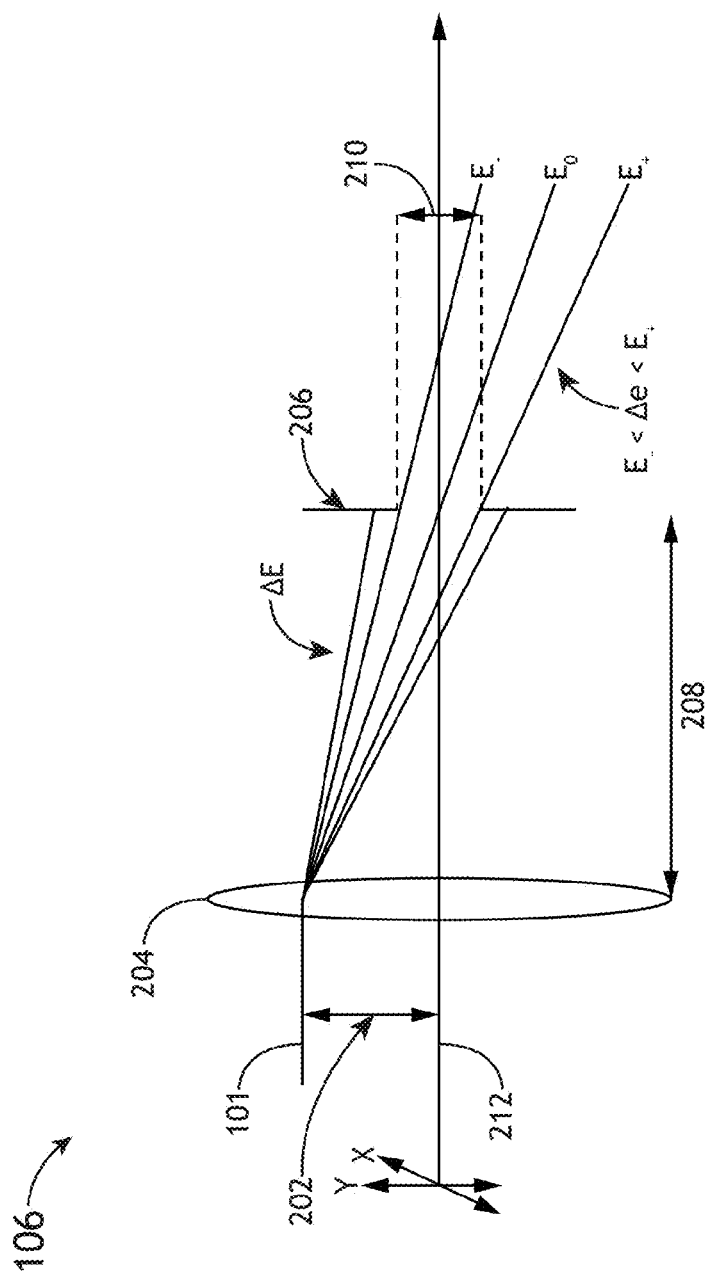
FIG. 1B is a schematic view of a system to filter an energy spread of an electron beam in accordance with one embodiment of the present disclosure.
Figure 2:
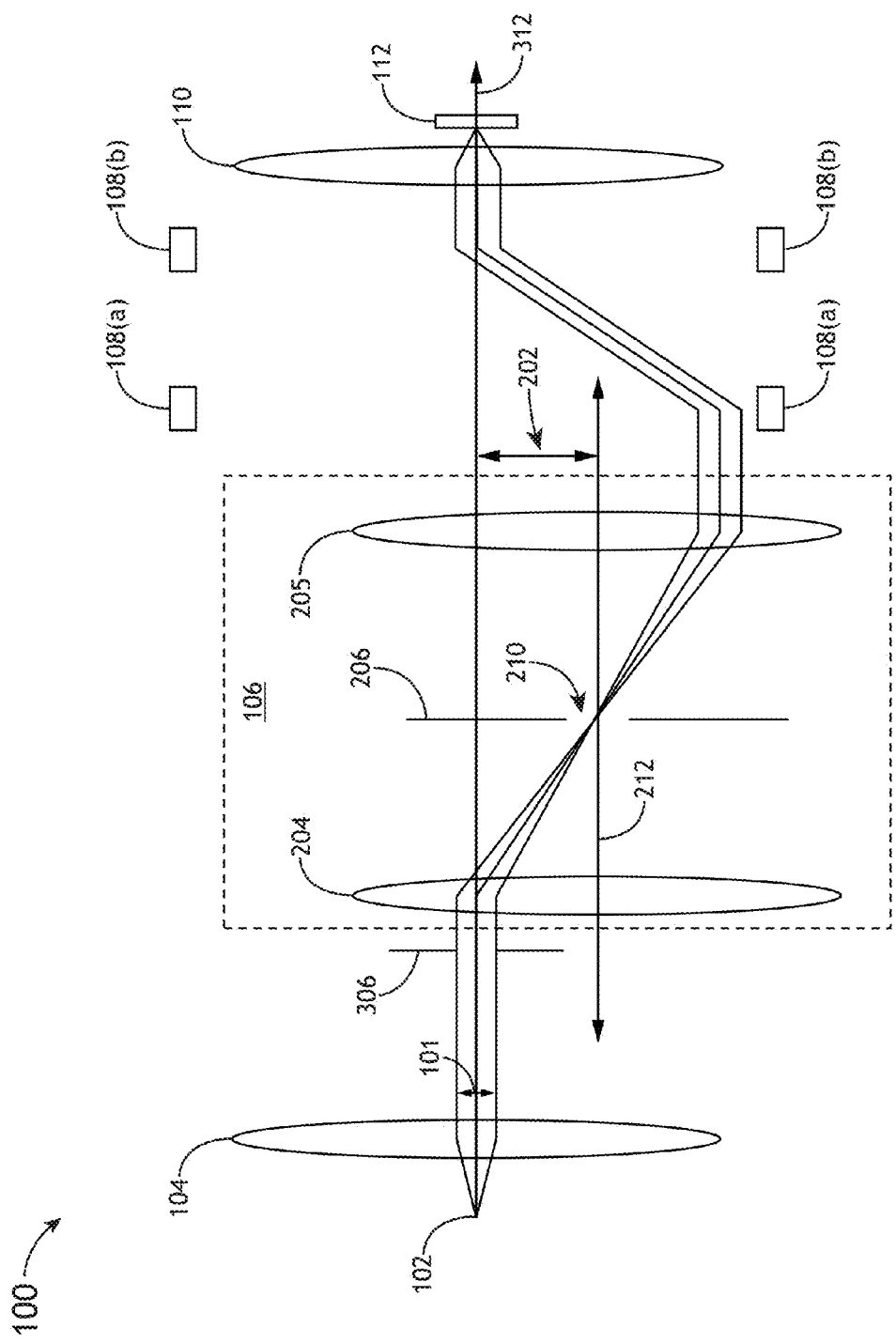
FIG. 2 is a schematic view of a system to illuminate a sample with an electron beam filtered by an off-axis energy filtering sub-system in accordance with one embodiment of the present disclosure.

FIG. 1B is a simplified schematic of an energy filtering sub-system 106 according to one or more embodiments of the disclosure. An electron beam 101 is directed to an electron lens 204 with an optical axis 212 at an off-axis distance 202. It is noted herein that the electron beam 101 prior to interaction with the electron lens 204 in FIG. 1B is represented as a single electron ray for purposes of clarity. The electron lens 204 is positioned to introduce spatial dispersion into the beam such that the degree of deflection of electrons passing through the electron lens 204 varies according to the electron energy. In one embodiment, the beam 101 is directed to an aperture 206 with an opening of width 210 located at a distance 208 from the electron lens 204. The aperture operates as a spatial filter and selects a set of electron energies, $E_-<\Delta e<E_+$, to continue propagating through the system 100. It is noted herein that the electron lens 204 may include either a single electron lens or, alternatively, one or more electron lenses forming a compound lens system.

In one embodiment, a collimated electron beam 101 is directed to an electron lens 204 and an aperture 206 is positioned at the back focal length of the lens 204, i.e. at a distance 208 equal to the focal length of the lens 204 located on the side of the lens opposite the incident electron beam 101. In this configuration, the aperture 206 is in a plane conjugate to the source of the collimated electron beam 101 in an infinite conjugate configuration. In additional embodiments, the aperture 206 and the source 102 of the electron beam 101 may be positioned in any number of finite conjugate positions. In these embodiments, the electron lens 204 as well as any electron lenses (e.g. 104) positioned in the beam path generate an image of the source 102 of the electron beam 101 at the position of the aperture 206. It is noted herein that minor adjustments to the positions of the electron lens 204 and aperture 206 made in order to account for diffraction and aberrations are within the spirit and scope of the present disclosure.

Referring generally to FIGS. 2-6, in some embodiments of the present disclosure, the energy filtering sub-system 106 includes two electron lenses 204 and 205 that share an optical axis 212 that is shifted from the primary optical axis 312 by a distance 202. It is noted herein that the electron rays depicted as the beam 101 are intended to illustrate the envelope of rays associated with the beam 101. Furthermore, the spatial dispersion of the beam introduced after electron lens 204 is not shown for purposes of clarity. In one embodiment, an electron beam 101 generated by an electron source 102 is collected and collimated by an electron lens 104. The diameter of the beam 101 is defined by the opening of an aperture 306. In another embodiment, the beam 101 is then directed to an electron lens 204 at an off-axis position such that spatial dispersion is introduced to the beam 101. Again, the presence of spatial dispersion is not illustrated for purposes of clarity. The electron beam 101 is then directed to an aperture 206 positioned an image plane of the source 102 such that all electrons from a given position of the source 102 are focused to a single position on the aperture 206. The width 210 of an opening of the aperture 206 defines the energy spread $\Delta e$ of the beam 101 passing through the aperture 206. The electron beam 101 is then collected and collimated by electron lens 205. A pair of electron deflectors 108 is positioned to redirect the beam 101 to be collinear with the optical axis 312. An electron objective lens 110 is positioned to focus the beam onto a sample 112. It is noted herein that astigmatism introduced into the beam by the path through the system 100 may be compensated for using stigmators. It is further noted that one advantage of embodiments wherein the energy filtering sub-system 106 includes axis-shifted lenses is that energy spread filtering is achieved using only a minor modification to the design of existing equipment.

It is noted herein that in some embodiments of the present disclosure, high current densities in the electron beam 101 may be achieved by: first, collecting electrons from an electron source 102 with an electron lens 104; second, controlling the beam diameter with an on-axis aperture 306; and third, positioning an energy filtering sub-system 106 after the aperture 306. This configuration enables the collection of a high current density electron beam along the optical axis 312.

Referring generally to FIGS. 3-6, in some embodiments of the present disclosure, the system 100 is configurable to operate in multiple operational modes. For example, a low beam current mode for which energy filtering of the beam 101 is enabled, and a high beam current mode for which energy filtering of the beam 101 is disabled. In one embodiment, switching between a low current mode and a high current mode is achieved through a modification of the focal power of electron lenses 104, 204, 205, 304, and 305 as well as through the operation of one or more electron deflectors 108. It is noted herein that in some embodiments, the same optical column is used for both operational modes.

It is noted herein that a low beam current mode may be particularly useful for applications for which maximum resolution is desired such as high resolution scanning electron microscope imaging systems or review systems. For such applications, relatively low beam currents are typically used to avoid Coulomb interactions between electrons. In such applications, a reduction of the energy spread through the energy-filtering sub-system is highly desirable. It is further noted herein that a high current mode may be particularly useful for applications requiring beam currents sufficiently high that the resolution is dominantly limited by Coulomb interactions between electrons and spherical aberration rather than chromatic aberration. Therefore, the energy filtering sub-system is not needed and any off-axis interactions with electron lenses are avoided. This high-current mode may commonly be used for electron beam wafer inspection (EBI), for example. The ability to switch between the high beam current mode and the low beam current mode enables a highly-flexible platform suitable for many applications.

Referring generally to FIGS. 3A, 4A, 5A, and 6A, in some embodiments of the present disclosure, the system 100 is configured to operate in a low current beam mode. In one embodiment, an electron lens 104 with an optical axis 312 collimates a beam 101 with an energy spread $\Delta E$ generated from an electron source 102. An aperture 306 with an opening on the optical axis 312 defines the diameter of the beam. Electron lenses 304 and 305 positioned on optical axis 312 are configured to have a focal power of 0 and are thus configured to not focus the beam. Electron lenses 204 and 205 are positioned to share an optical axis 212 shifted from optical axis 312 by a distance 202. Electron lens 204 is further configured to both image the electron source 102 onto an aperture 206 and to introduce spatial dispersion into the beam 101. The aperture 206 has an opening positioned on the optical axis 212 and is configured to reduce the energy spread of the beam 101 to $\Delta e < \Delta E$. Electron lens 205 collects and collimates the beam 101. A pair of electron deflectors 108 direct the beam in a telecentric configuration to an electron objective lens 110 positioned to focus the beam 101 onto a sample 112.

Referring generally to FIGS. 3B, 4B, 5B, and 6B, in some embodiments of the present disclosure, the system 100 is configured to operate in a high current beam mode. In one embodiment, an electron lens 104 with an optical axis 312 collects and focuses a beam 101 generated from an electron source 102 and modifies the beam current by controlling the rays of electrons that pass through an aperture 306. Electron lenses 204 and 205, sharing an optical axis 212 shifted from optical axis 312 by a distance 202, are configured to have a focal power of 0 and are thus configured to not focus the beam. Electron lens 304 is positioned to share the optical axis 312 and is configured to image the electron source 102 onto the aperture 206. The aperture 206 has an opening positioned on optical axis 312. It is noted herein that the since the beam 101 is directed to an on-axis position, the beam is not spatially dispersed when propagating through the aperture 206 and thus energy filtering does not occur. Electron lens 305 is positioned to collimate the beam 101. Electron deflectors 108 are configured not to deflect the beam. The beam 101 is then incident on an electron objective lens 110 positioned to focus the beam 101 onto a sample 112.

It is noted herein that any of the one or more openings of the aperture 206 may be configured to be any desirable shape; the choice of the shape of openings may be driven by manufacturing considerations as well as engineering considerations. By way of a non-limiting example, any of the one or more openings of the aperture 206 may be configured to be in the shape of a slit in order to improve manufacturability at a given performance specification. By way of a second non-limiting example, an aperture 206 may be configured to have a round central opening for high beam current mode operation and a slit opening at an off-axis position on optical axis 212 at a distance 202 from optical axis 312 for low-beam current energy filtering operation. It is further noted that slit-shaped openings may reduce the potential for clogging or undesirable charging effects.

Figure 3A:
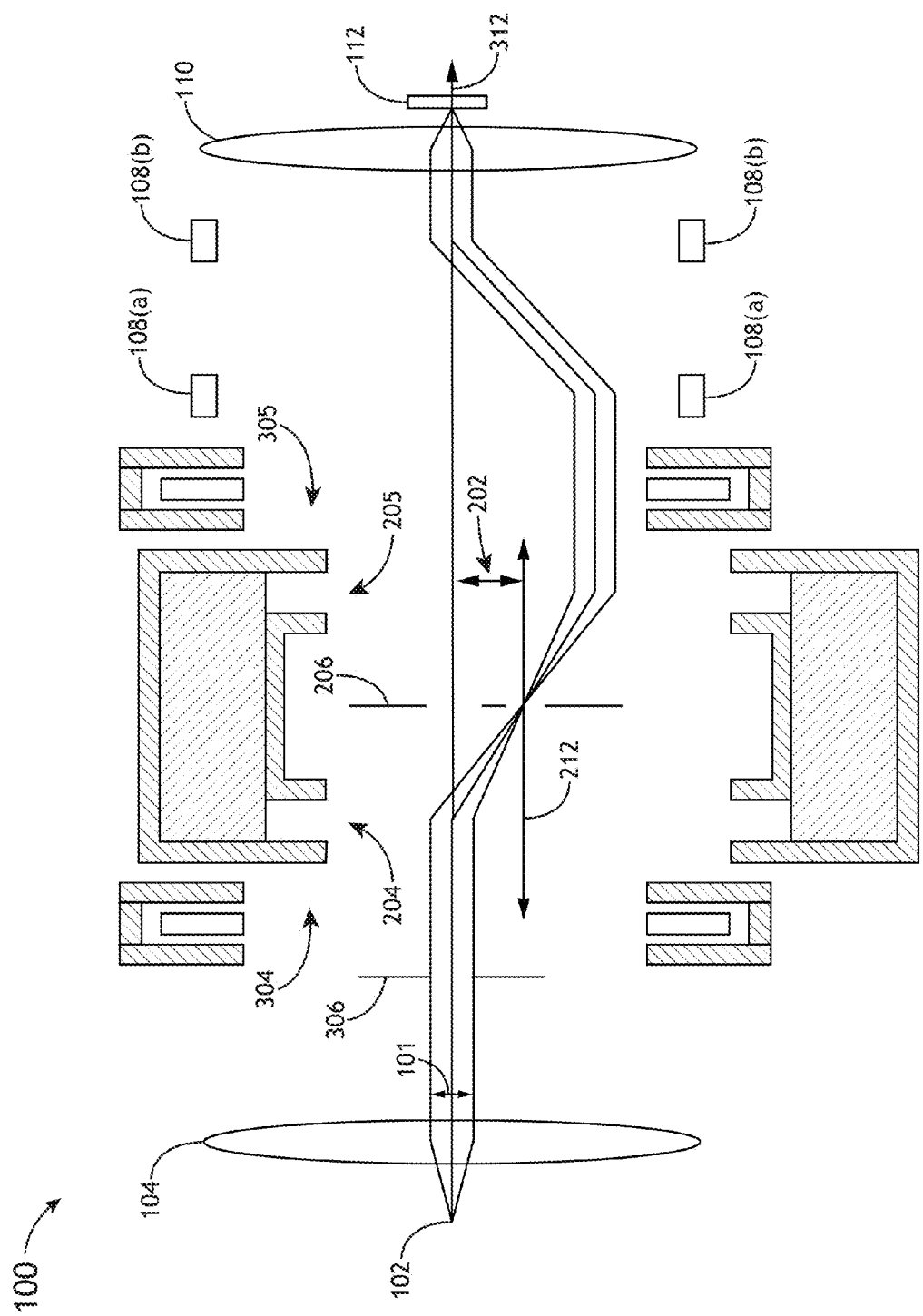
FIG. 3A is a cross-sectional schematic view of a selectively configurable system to illuminate a sample with an electron beam filtered by an off-axis energy filtering sub-system including a combined magnetic lens in accordance with one embodiment of the present disclosure.
Figure 3B:
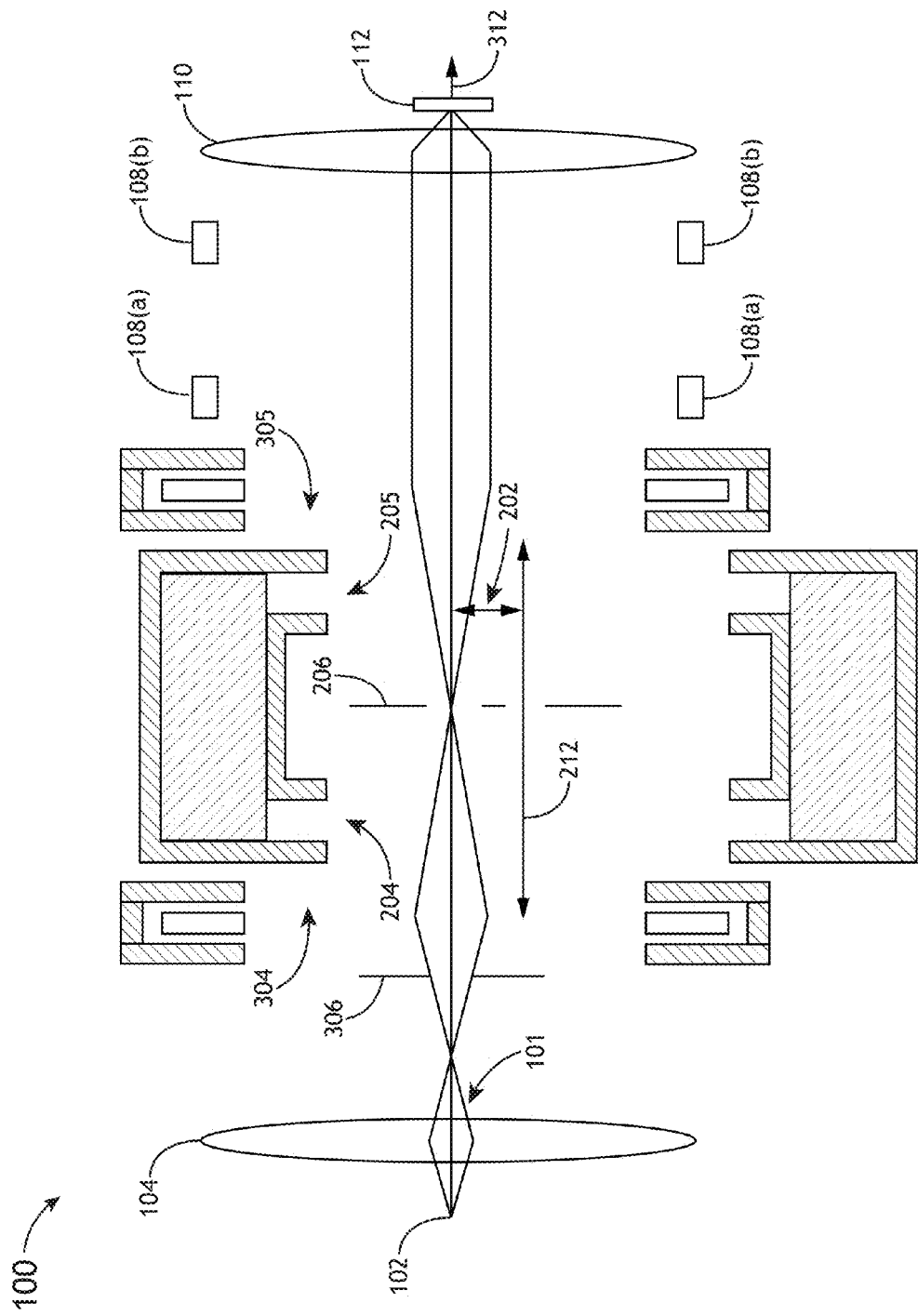
FIG. 3B is a cross-sectional schematic view of a selectively configurable system to illuminate a sample with an electron beam with an alternate beam path in which the beam is not filtered by an off-axis energy filtering sub-system including a combined magnetic lens in accordance with one embodiment of the present disclosure.

It is noted herein that any of the electron lenses in the system 100 and may include one or more of any type of electron lens known in the art including, but not limited to, electrostatic, magnetic lenses, uni-potential, double-potential, retarding, and accelerating lens technologies. It is further noted that pairs of electron lenses in the system may be physically fabricated as a single component. Referring to FIGS. 3A and 3B, in one embodiment, electron lenses 304 and 305 include electrostatic lenses. In another embodiment, electron lenses 204 and 205 include a combined magnetic lens with a common coil held by magnetic pole pieces. In another embodiment, electrons 204 and 205 include electrostatic lenses.

Figure 4A:
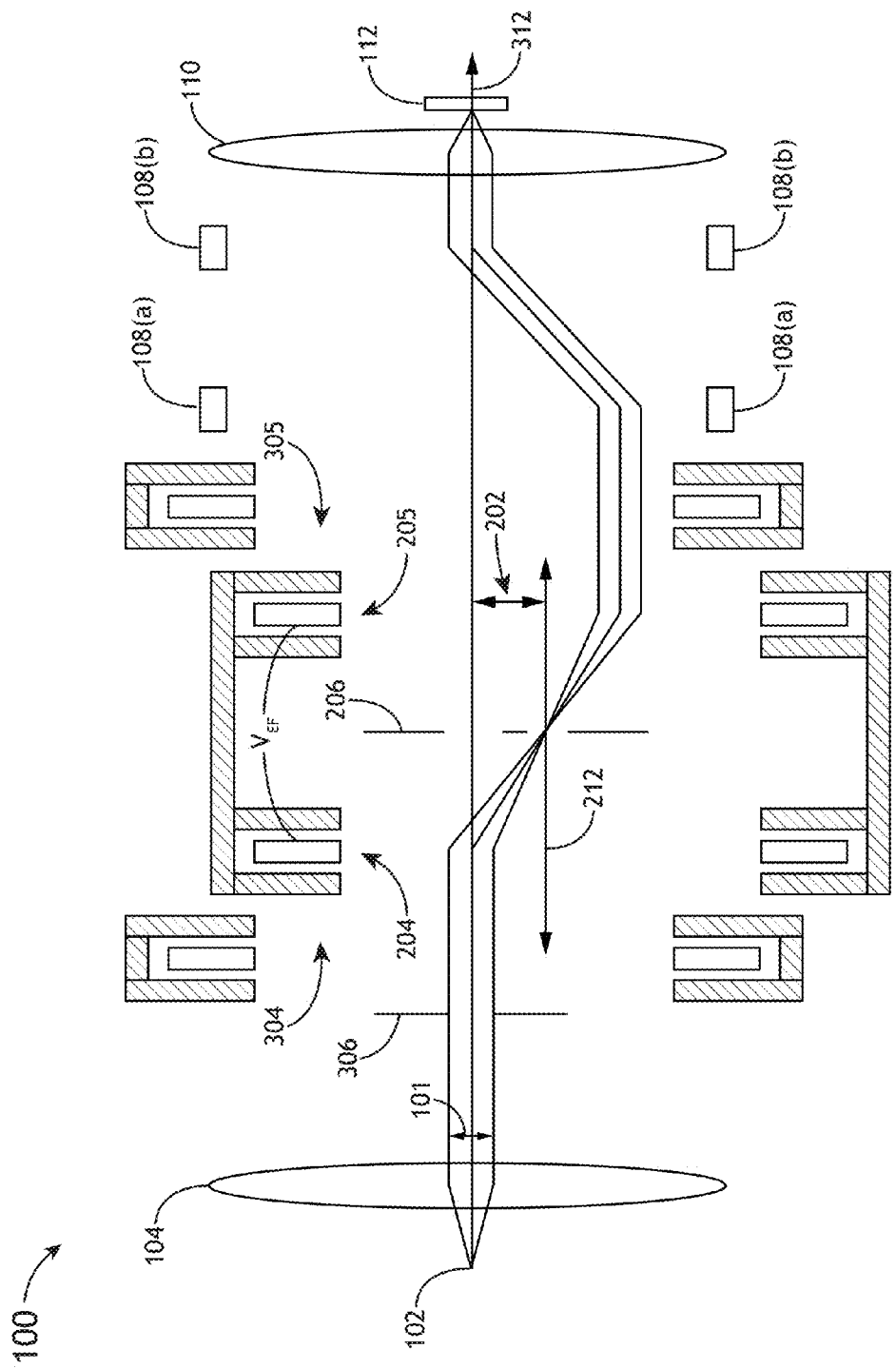
FIG. 4A is a cross-sectional schematic view of a selectively configurable system to illuminate a sample with an electron beam filtered by an off-axis energy filtering sub-system including a combined electrostatic lens configured with an energy filtering voltage in accordance with one embodiment of the present disclosure.
Figure 4B:
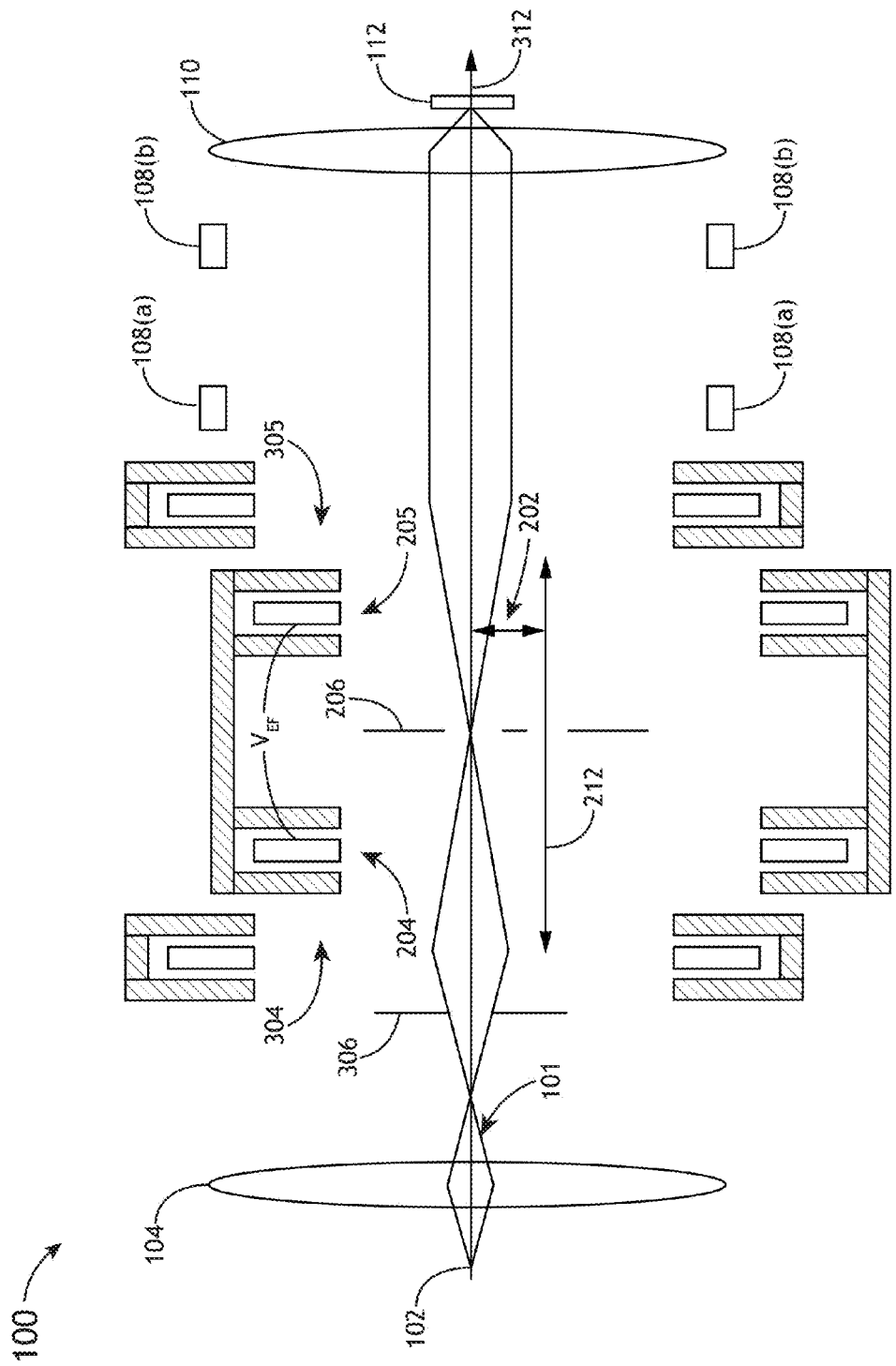
FIG. 4B is a cross-sectional schematic view of a selectively configurable system to illuminate a sample with an electron beam with an alternate beam path in which the beam is not filtered by an off-axis energy filtering sub-system including a combined electrostatic lens configured with an energy filtering voltage in accordance with one embodiment of the present disclosure.

Referring to FIGS. 4A and 4B, in one embodiment, electron lenses 204 and 205 further include a combined electrostatic lens with an energy filtering voltage $V_{EF}$. In another embodiment, electron lenses 304 and 305 include electrostatic lenses. It is noted herein that an electrostatic lens include a uni-potential lens (e.g. an Einzel lens) and/or a double-potential lens (e.g. retarding or accelerating lenses). It is further noted that embodiments including electrostatic lenses may provide faster switching speeds than embodiments using magnetic lenses or a combination of electrostatic and magnetic lenses.

Figure 8B:
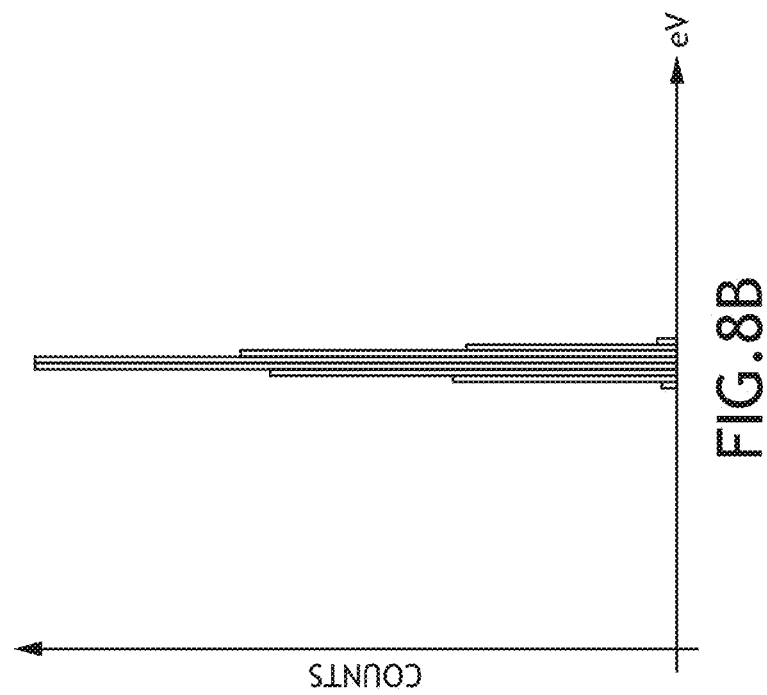
FIG. 8B is a histogram of the energy spread of an electron beam after energy filtering in accordance with one embodiment of the present disclosure.
Figure 8A:
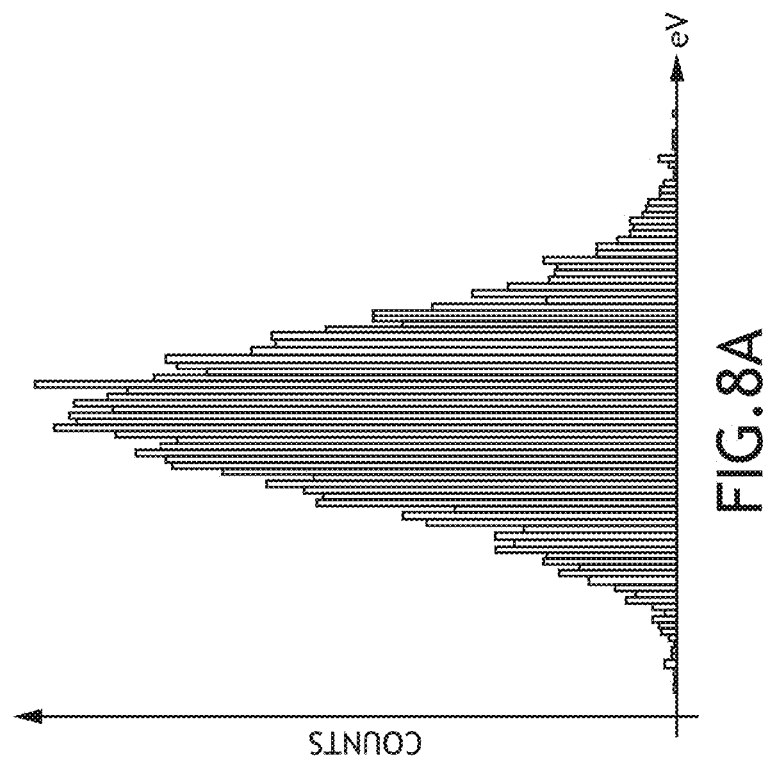
FIG. 8A is a histogram of the energy spread of an electron beam before energy filtering in accordance with one embodiment of the present disclosure.
Figure 9:
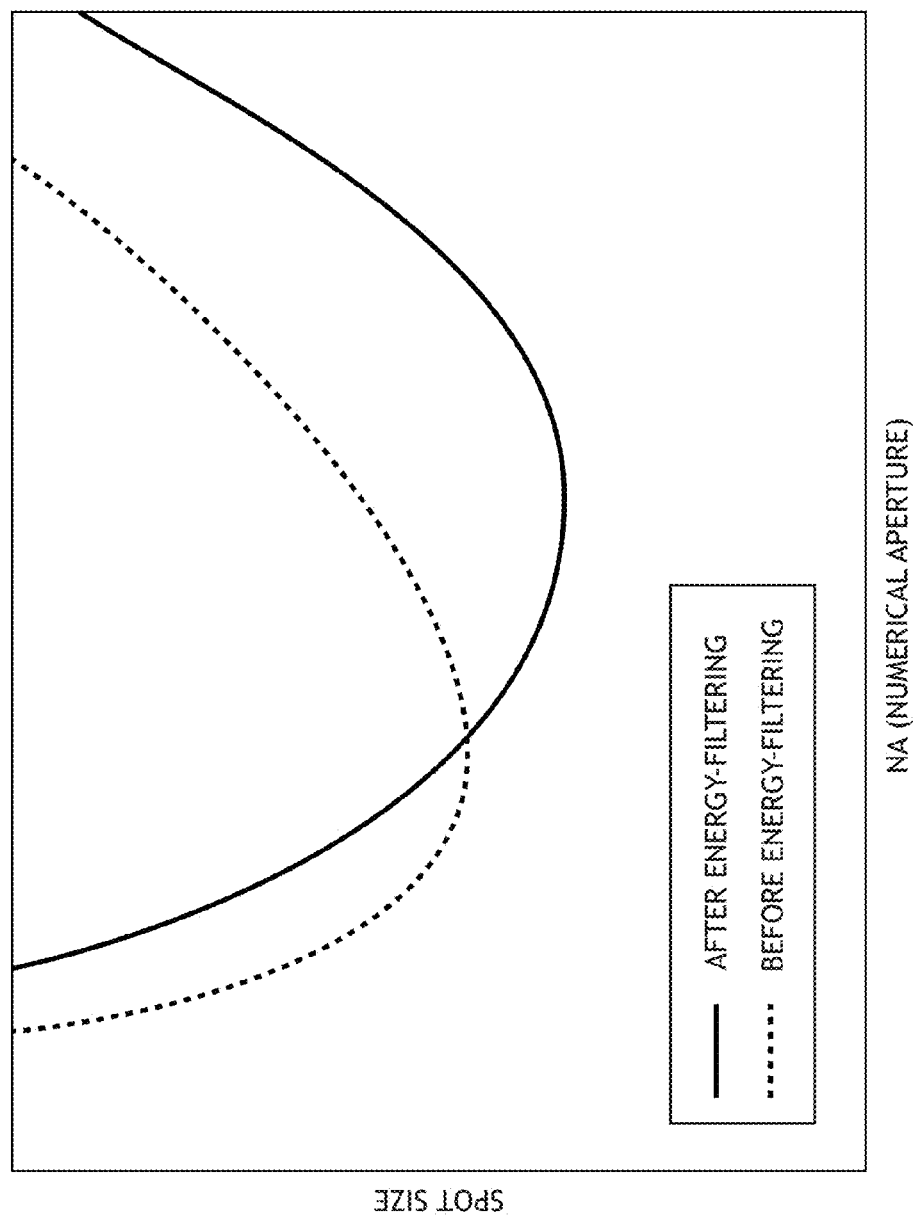
FIG. 9 is a simulation plot of the beam focusing dynamics with and without energy filtering in accordance with one embodiment of the present disclosure.

Monte Carlo computer simulations of the energy spread filtering performance of a system 100 in accordance with one embodiment of the present disclosure are shown in FIGS. 8A and 8B. FIG. 8A shows a histogram plot of electron energies $\Delta E$ included in the energy spread before filtering, and FIG. 8B shows a histogram plot of electron energies $\Delta e$ included in the energy spread after energy filtering. It is noted herein that the bin size of the histogram plots in FIGS. 8A and 8B are the same. This reduction in the energy spread reduces chromatic aberration introduced by other elements in the system such as the objective lens 110 and thus provides an enhanced system resolution. A simulation of the beam focusing dynamics with and without energy filtering is shown in FIG. 9.

It is noted herein that one advantage of the present disclosure is flexibility in designing the system around several key parameters including the energy spread of the filtered electron beam ($\Delta e$), the central wavelength of the energy spread of the filtered electron beam ($E_0$), the off-axis shift distance 202 (R), and the width of the opening 210 of the aperture 206 (D). These parameters are related by equation 1:

$$\Delta e / E_0 \propto D/R \quad (1).$$

Accordingly, the energy spread of the filtered electron beam is proportional to both $E_0$ and D, and is inversely proportional to R. This relationship can be exploited in a number of ways such as increasing system resolution through appropriate design of $E_0$, D, and R. Alternatively, this relationship can be exploited to relax manufacturing requirements. For example, because the energy spread of the electron beam is proportional to D, it is often desirable to minimize this dimension in order to minimize the adverse effects associated with energy spread. However, this size is often physically limited by the manufacturing process used to generate the opening. Referring to FIG. 1B, the energy spread of the filtered electron beam 101 is limited by the width of the opening 210 of the aperture 206 (D), which is oriented in the direction of the axial shift 202 (along the y-axis). The size of the opening along the x-axis may be increased in order to reduce manufacturing constraints (i.e. the opening can be a slit that is longer along the x-axis than the y-axis). Additionally, increasing the value of R in the system may enable a corresponding increase in the manufacturing requirements of D without sacrificing resolution.

Figure 5A:
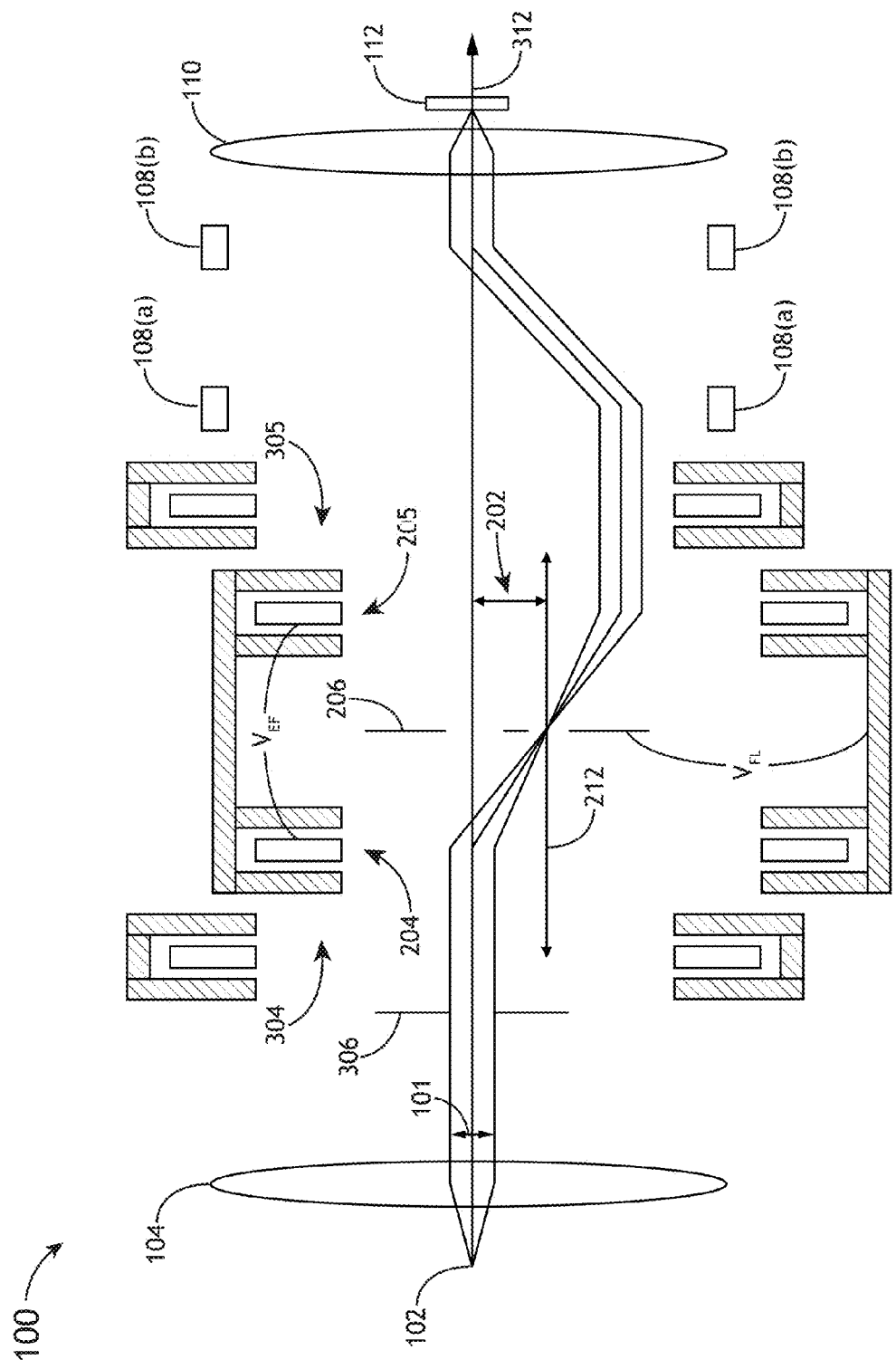
FIG. 5A is a cross-sectional schematic view of a selectively configurable system to illuminate a sample with an electron beam filtered by an off-axis energy filtering sub-system including a combined electrostatic lens configured with an energy filtering voltage and electrically floated with a floating voltage in accordance with one embodiment of the present disclosure.
Figure 5B:
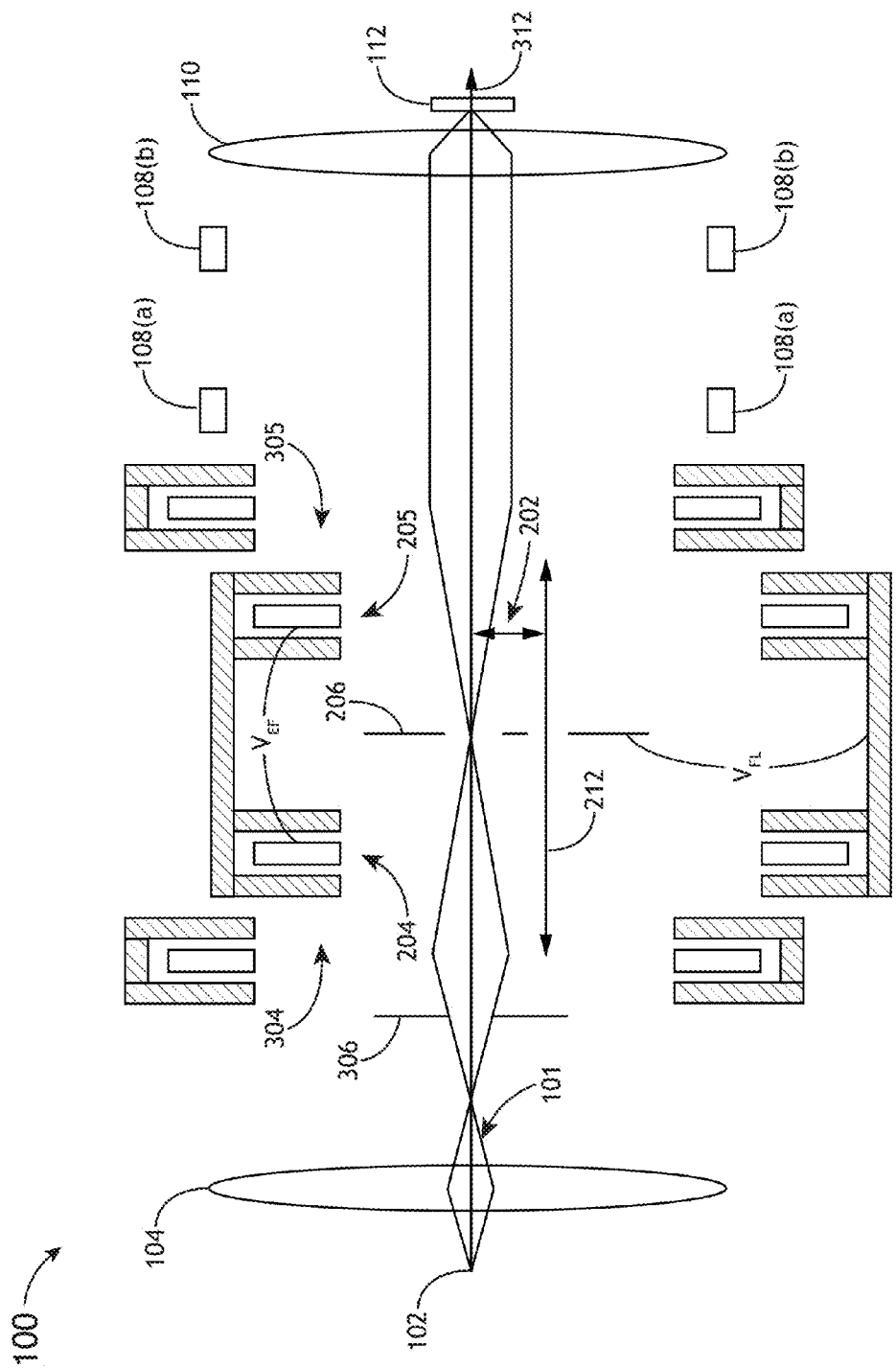
FIG. 5B is a cross-sectional schematic view of a selectively configurable system to illuminate a sample with an electron beam with an alternate beam path in which the beam is not filtered by an off-axis energy filtering sub-system including a combined electrostatic lens configured with an energy filtering voltage and electrically floated with a floating voltage in accordance with one embodiment of the present disclosure.

It is contemplated herein that decreasing the value of $E_0$ during the energy filtering process can additionally improve system performance and/or relax manufacturing requirements. According to equation 1, a reduction of $E_0$ may either decrease the filtered energy spread $\Delta e$ for set values of D and R; alternatively, a reduction of $E_0$ may increase the size of D for set values of $\Delta e$ and R. Referring to FIG. 5A, in one embodiment of the present disclosure, electron lenses 204 and 205 are electrically floated with a negative voltage, $V_{FL}$. Thus, the central energy of the energy spread of the beam 101 is reduced from $E_0$ to $E_0 + V_{FL}$ for the energy filtering process. Referring to FIG. 5B, in another embodiment of the present disclosure, the negative floating voltage, $V_{FL}$, is removed for high beam current operation.

Figure 6A:
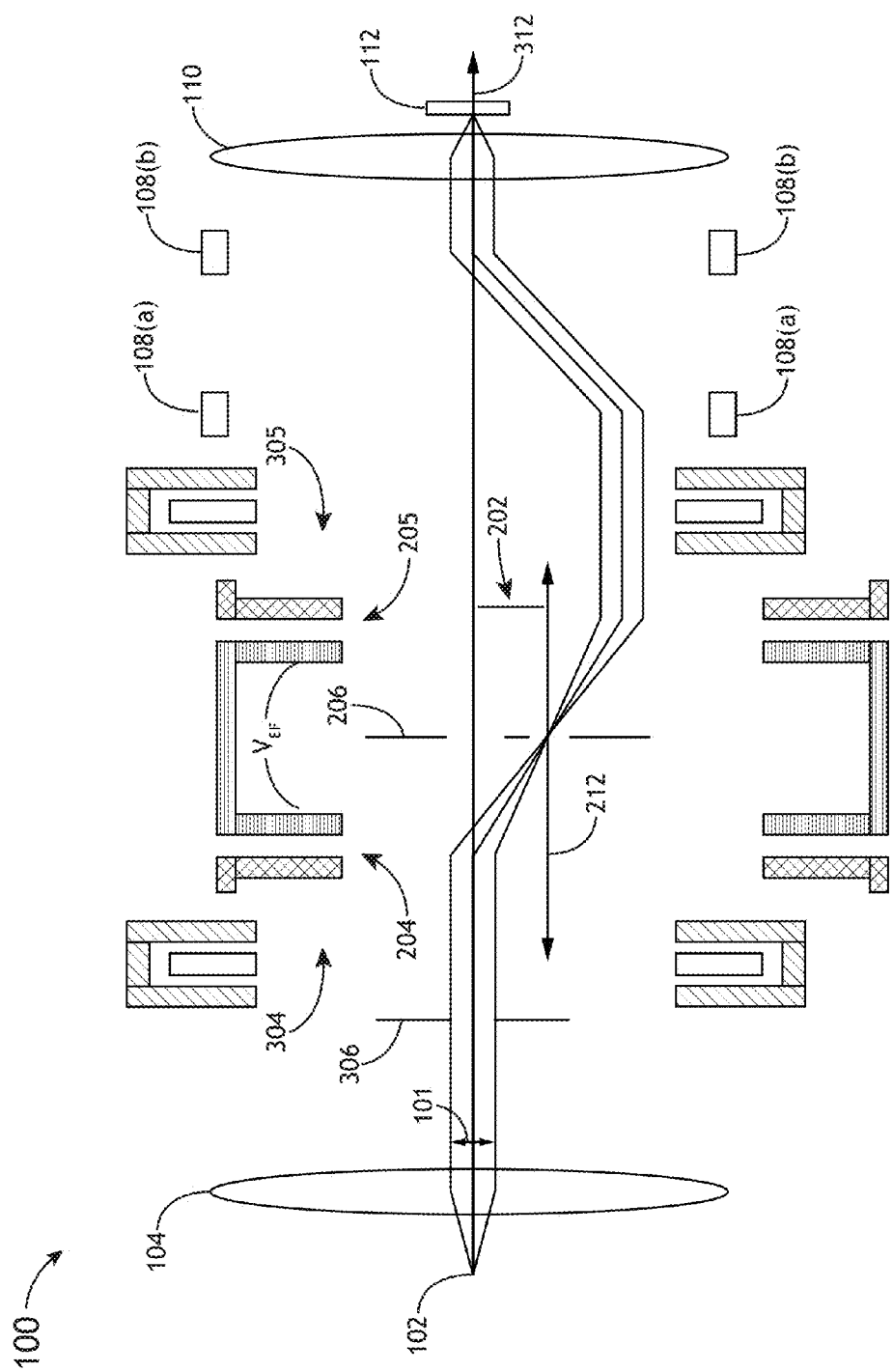
FIG. 6A is a cross-sectional schematic view of a selectively configurable system to illuminate a sample with an electron beam filtered by an off-axis energy filtering sub-system including a combined double-potential electrostatic lens configured with an energy filtering voltage, one retarding lens, and one accelerating lens in accordance with one embodiment of the present disclosure.
Figure 6B:
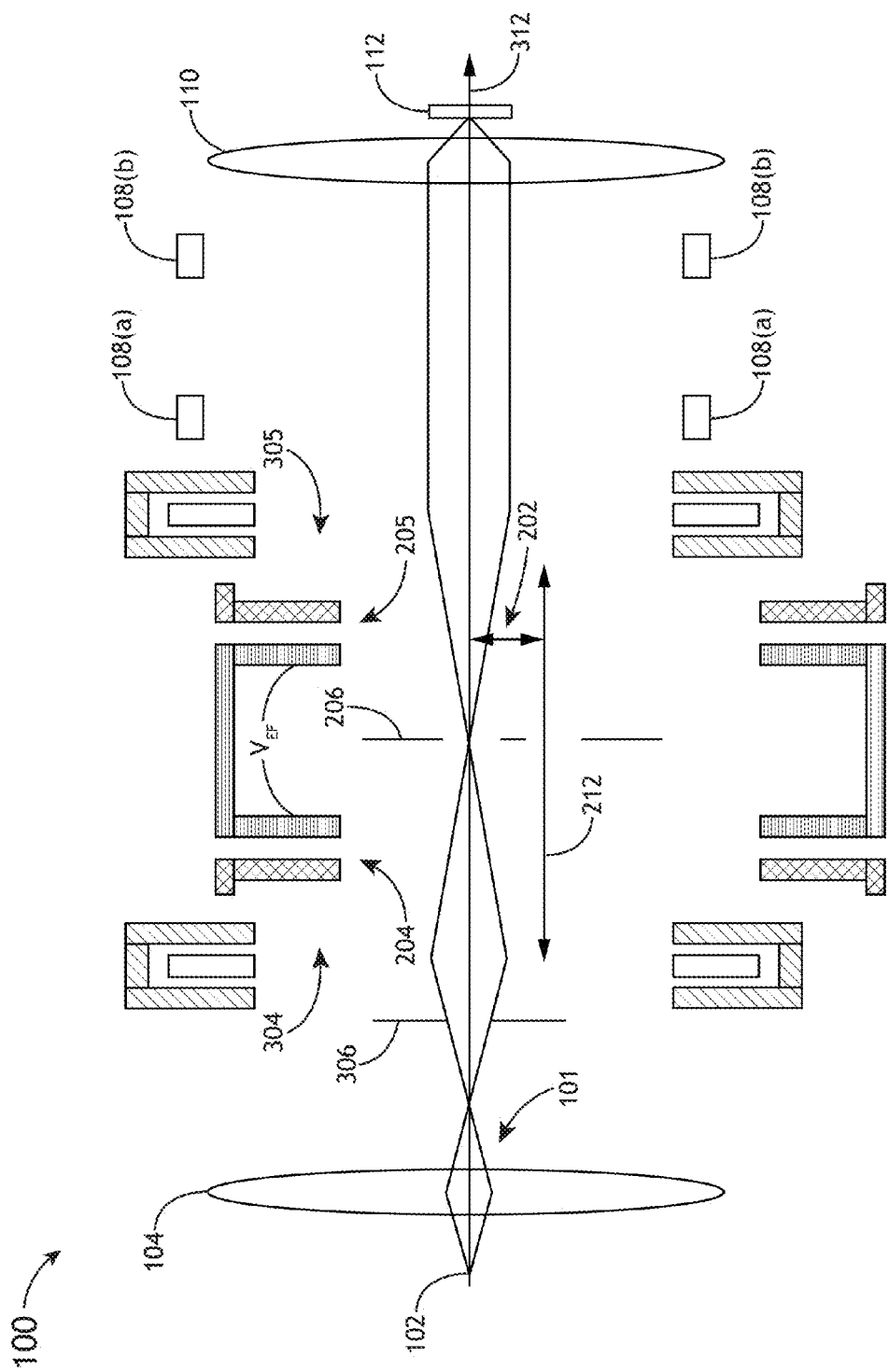
FIG. 6B is a cross-sectional schematic view of a selectively configurable system to illuminate a sample with an electron beam with an alternate beam path in which the beam is not filtered by an off-axis energy filtering sub-system including a combined double-potential electrostatic lens configured with an energy filtering voltage, one retarding lens, and one accelerating lens in accordance with one embodiment of the present disclosure.

Referring to FIG. 6A, in one embodiment of the present disclosure, electron lenses 204 and 205 include double-potential lenses in a retarding/accelerating configuration. A negative potential, $V_{EF}$, is applied such that the potentials in the incident and exit sizes of each of lenses 204 and 205 are unequal. In this way, electron lens 204 is configured to be a retarding lens and electron lens 205 is configured to be an accelerating lens. Further, electron lens 204 and electron lens 205 can either be fabricated as individual elements or as a combined lens. It is noted herein that embodiments wherein electron lenses 204 and 205 include double-potential lenses enable efficient system design, fast switching times, and improved performance associated with a reduction of $E_0$ during energy filtering.

Figure 7:
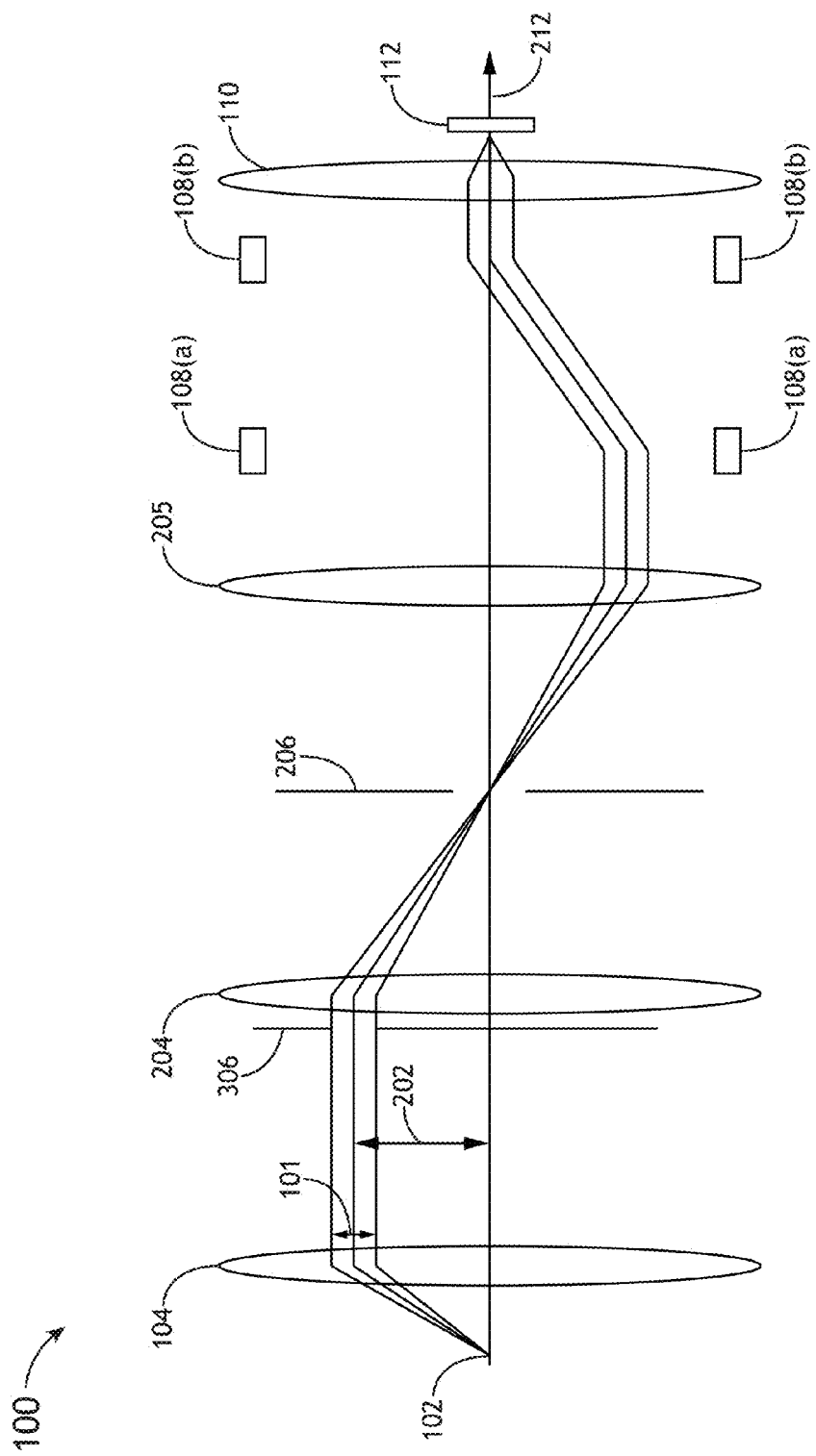
FIG. 7 is a schematic view of a system to illuminate a sample with an electron beam filtered by an on-axis energy filtering sub-system with a selectively configurable aperture in accordance with one embodiment of the present disclosure.

Referring generally to FIG. 7, in some embodiments of the present disclosure, all the electron lenses in the system 100 are positioned on the same optical axis 212. In one embodiment, an electron lens 104 collects and collimates an electron beam 101 generated from an electron source 102. A movable aperture 306 is positioned to control the beam diameter to direct the beam 101 to an electron lens 204 at an off-axis distance 202 from optical axis 212 such that spatial dispersion is introduced to the beam 101. The electron beam 101 is then directed from the electron lens 204 and focused onto an aperture 206 positioned on an image plane of the electron source 102. The size of the opening 210 of the aperture 206 will determine the energy spread of the filtered beam, $\Delta e$. An electron lens 205 is positioned to collimate the electron beam 101. A pair of electron deflectors 108 direct the beam 101 in a telecentric configuration to an electron objective 110 positioned to focus the beam 101 onto a sample 112. In one embodiment, the movable aperture 306 has one or more openings that can be selectively positioned at any number of off-axis positions at a distance 202 from optical axis 212. In another embodiment, both the size and location of the opening of the movable aperture 306 can be selectively adjusted. It is noted herein that a movable aperture enables the system 100 to operate in multiple operation modes. In another embodiment, the movable aperture 306 is positioned on the optical axis 212 such that the beam 101 is incident on the electron lens 204 at an on-axis position. The electron beam 101 does not become spatially dispersed upon interaction with electron lens 204 and the energy spread of the beam is not filtered.

It is noted herein that the electron lenses 204 and 205 may include any type of electron lenses known in the art including, but not limited to, electrostatic, magnetic, uni-potential, or double-potential lenses. It is further noted that embodiments wherein all electron lenses are positioned on a common optical axis 212 may simplify system design, reduce the number of components in the system, reduce the overall physical size of the system, and/or reduce the length of the beam path. A reduction of the beam path may be particularly beneficial for high beam current operation in which Coulomb interactions between electrons may significantly degrade system performance.

In another embodiment, the sample 112 is disposed on a sample stage 114 suitable for securing the sample 112 during scanning. In another embodiment, the sample stage 114 is an actuatable stage. For example, the sample stage 114 may include, but is not limited to, one or more translational stages suitable for selectably translating the sample 106 along one or more linear directions (e.g., x-direction, y-direction and/or z-direction). By way of another example, the sample stage 108 may include, but is not limited to, one or more rotational stages suitable for selectably rotating the sample 112 along a rotational direction. By way of another example, the sample stage 114 may include, but is not limited to, a rotational stage and a translational stage suitable for selectably translating the sample along a linear direction and/or rotating the sample 112 along a rotational direction.

In another embodiment, the electron inspection sub-system 116 includes one or more electron beam scanning elements. For example, the one or more electron beam scanning elements may include, but are not limited to, one or more scanning coils or deflectors suitable for controlling a position of the beam relative to the surface of the sample 112. In this regard, the one or more scanning elements may be utilized to scan the electron beam 101 across the sample 112 in a selected pattern. It is noted herein that the inspection sub-system 116 may operate in any scanning mode known in the art. For example, the inspection sub-system 116 may operate in a swathing mode when scanning an electron beam 101 across the surface of the sample 112. In this regard, the inspection sub-system 116 may scan an electron beam 101 across the sample 112, while the sample is moving, with the direction of scanning being nominally perpendicular to the direction of the sample motion. By way of another example, the inspection sub-system 116 may operate in a step-and-scan mode when scanning an electron beam 101 across the surface of the sample 112. In this regard, the inspection sub-system 116 may scan an electron beam 101 across the sample 112, which is nominally stationary when the beam 101 is being scanned.

In another embodiment, the inspection sub-system includes a detector assembly 118. In one embodiment, the detector assembly 118 includes an electron collector 117 (e.g., a secondary electron collector). In another embodiment, the detector assembly 118 includes a detector 119 (e.g., a scintillating element and a photomultiplier tube (PMT) detector 119) for detecting electrons from the sample surface (e.g., secondary electrons).

While the foregoing description focused on the detector assembly 118 in the context of the collection of secondary electrons, this should not be interpreted as a limitation on the present invention. It is recognized herein that the detector assembly 118 may include any device or combination of devices known in the art for characterizing a sample surface or bulk with an electron beam 101. For example, the detector assembly 118 may include any particle detector known in the art configured to collect backscattered electrons, Auger electrons, transmitted electrons or photons (e.g., x-rays emitted by surface in response to incident electrons).

In another embodiment, the detector 119 of the detector assembly 118 includes a light detector. For example, the anode of a PMT detector of the detector 119 may consist of a phosphor anode, which is energized by the cascaded electrons of the PMT detector absorbed by the anode and subsequently emits light. In turn, the light detector may collect light emitted by the phosphor anode in order to image the sample 106. The light detector may include any light detector known in the art, such as, but not limited to, a CCD detector or a CCD-TDI detector.

It is noted herein that the set of electron optics of system 100 as described above and illustrated in FIGS. 1-7 are provided merely for illustration and should not be interpreted as limiting. It is anticipated that a number of equivalent or additional configurations may be utilized within the scope of the present invention. By way of a non-limiting example, one or more electron lenses or apertures may be positioned prior to the wavelength filtering sub-system 106. By way of an additional non-limiting example, the electron inspection sub-system 116 may include one or more electron lenses, apertures, and/or stigmators.

Figure 10:
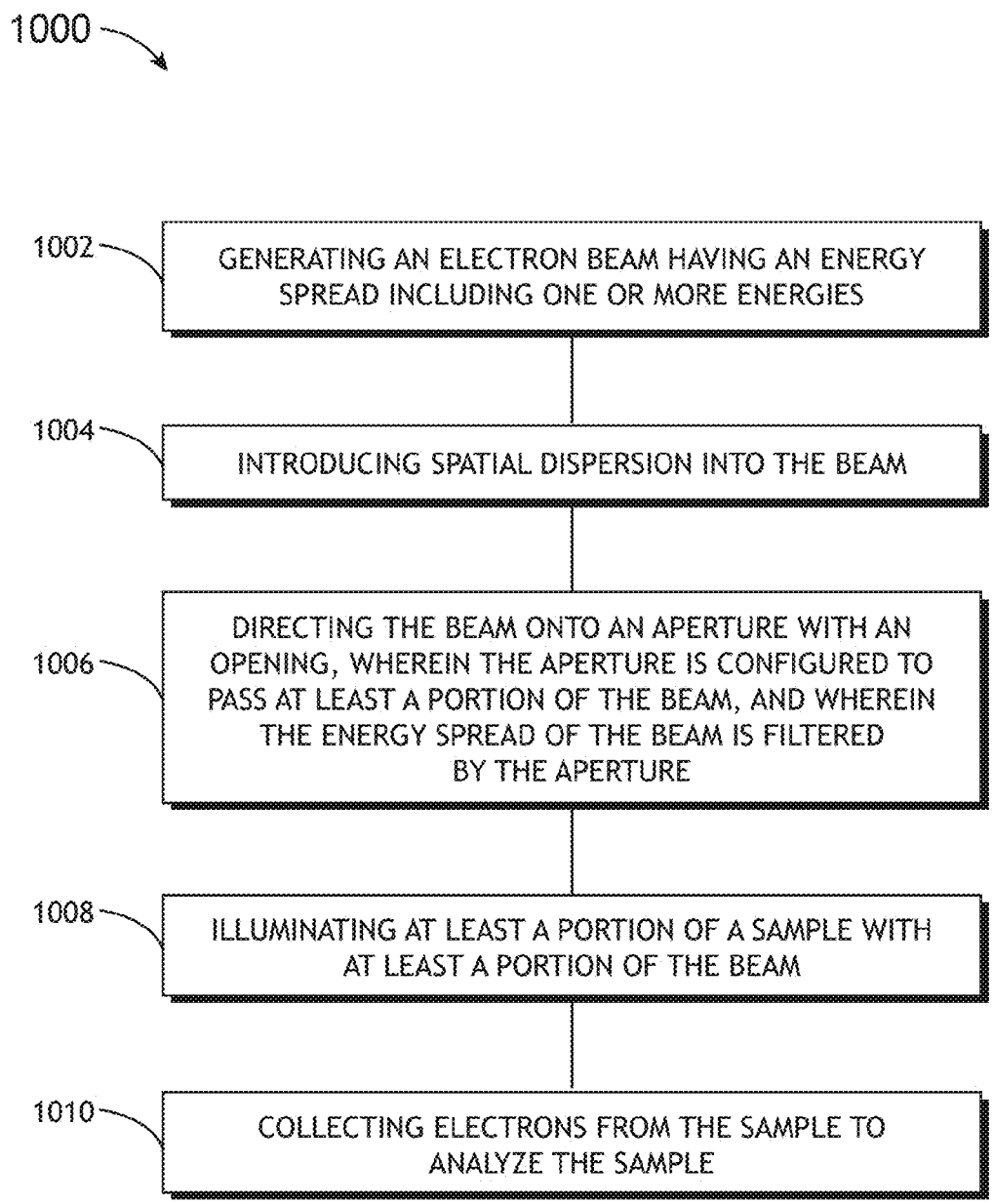
FIG. 10 is a flow diagram depicting a method for reducing the energy spread of an electron beam in accordance with one embodiment of the present disclosure.

FIG. 10 describes a flow diagram depicting a method 1000 for reducing the energy spread of an electron beam in accordance with one embodiment of the present invention. In step 1002, an electron beam having an energy spread including one or more energies is generated. In step 1004, spatial dispersion is introduced into the beam. In step 1006, the beam is directed to an aperture with an opening, wherein the aperture is configured to pass at least a portion of the beam. In this way, the energy spread of the beam is filtered by the aperture. In step 1008, at least a portion of the beam is directed to at least a portion of a sample to illuminate the sample. In step 1010, electrons from the sample are collected for the purposes of sample analysis.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A system comprising: an electron source configured to generate an electron beam having an energy spread including one or more energies, wherein the electron source is configured to emit the electron beam along a primary optical axis; a dispersing electron lens, wherein the dispersing electron lens is centered on a secondary optical axis different from the primary optical axis, wherein the dispersing electron lens is positioned such that the electron beam is incident on the dispersing electron lens at an off-axis position relative to the secondary optical axis, and further positioned to introduce spatial dispersion into the electron beam; and an aperture having one or more openings, wherein the aperture is positioned to pass at least a portion of the electron beam such that the energy spread of the electron beam is filtered.

2. The system of claim 1, further comprising a collecting electron lens positioned to collect the beam directed from the aperture.

3. The system of claim 1, wherein the electron lens includes any of a magnetic or an electrostatic lens.

4. The system of claim 1, wherein the electron source includes one or more electron guns.

5. The system of claim 1, wherein the opening of the aperture includes a slit.

6. The system of claim 1, further comprising a collecting electron lens, wherein the dispersing electron lens and the collecting electron lens are configured as a combined electron lens configured to share physical elements.

7. The system of claim 6, wherein the combined electron lens includes a combined magnetic lens including a common coil.

8. The system of claim 6, wherein the combined electron lens includes a combined electrostatic lens electrically configured with an energy filtering voltage.

9. The system of claim 8, wherein the combined electron lens includes one or more uni-potential lenses.

10. The system of claim 8, wherein the combined electron lens is configured to be electrically floated with a floating voltage.

11. The system of claim 8, wherein the combined electron lens includes one or more double-potential lenses.

12. The system of claim 11, wherein the dispersing electron lens includes a double-potential lens configured as a retarding lens, and wherein the collecting electron lens includes a double-potential lens configured as an accelerating lens.

13. A system for directing a beam of electrons with a limited energy spread to a sample, comprising: an electron source configured to generate an electron beam having an energy spread including one or more energies, wherein the electron source is configured to emit the electron beam along a primary optical axis; an energy filtering sub-system, comprising: a first electron lens, centered on a secondary optical axis different from the primary optical axis, positioned such that the electron beam is incident on the first electron lens at an off-axis position relative to the secondary optical axis, and further positioned to introduce spatial dispersion into the beam; an aperture having one or more openings positioned to pass at least a portion of the beam such that the energy spread of the beam is filtered, and a second electron lens positioned along the secondary optical axis, wherein the second electron lens is positioned to collect the beam directed from the aperture; a sample stage for securing one or more samples; and an electron inspection sub-system including one or more electron optics positioned to direct the beam onto the one or more samples.

14. The system of claim 13, wherein the first electron lens and the second electron lens are configured as a combined electron lens configured to share physical elements.

15. The system of claim 13, further comprising one or more electron deflectors positioned between the second electron lens and the electron inspection sub-system.

16. The system of claim 13, further comprising one or more stigmators.

17. The system of claim 13, further comprising one or more electron detectors.

18. The system of claim 17, wherein the one or more electron detectors include any of a secondary electron detector, a backscattered electron detector, or a photomultiplier tube detector.

19. The system of claim 13, wherein the electron source includes one or more electron guns.

20. The system of claim 13, wherein the opening of the aperture includes a slit.

* * * * *